United States Patent [19]

Machanian et al.

[11] 4,216,693
[45] Aug. 12, 1980

[54] MEANS FOR STORING BASS RHYTHM PATTERNS

[75] Inventors: William V. Machanian; Anthony C. Ippolito, both of De Kalb; William R. Hoskinson, Geneva, all of Ill.

[73] Assignee: The Wurlitzer Company, De Kalb, Ill.

[21] Appl. No.: 917,309

[22] Filed: Jun. 20, 1978

[51] Int. Cl.$^2$ .......................... G10H 1/00; G10H 5/00
[52] U.S. Cl. ................................. 84/1.03; 84/DIG. 12
[58] Field of Search ...................... 84/1.01, 1.03, 1.17, 84/1.24, DIG. 12, DIG. 22

[56] References Cited

U.S. PATENT DOCUMENTS

| | | | |
|---|---|---|---|
| 3,902,393 | 9/1975 | Machanian | 84/1.03 |
| 4,059,039 | 11/1977 | Carlson | 84/1.01 |

*Primary Examiner*—S. J. Witkowski
*Attorney, Agent, or Firm*—Trexler, Wolters, Bushnell & Fosse, Ltd.

[57] ABSTRACT

In accordance with the present invention, twelve different partials for a bass rhythm pattern are stored in only four columns of a ROM (Read Only Memory). The first three columns comprise a straight binary encoding of six different partials including the bass root, as well as no bass, while the fourth column is used for determining which of two octaves is to be played.

7 Claims, 4 Drawing Figures

MEANS FOR STORING BASS RHYTHM PATTERNS

BACKGROUND OF THE INVENTION

Various rhythm devices for use with electronic musical instruments are well-known. Such devices may be free running, i.e., have their own timing built in, or they may play in time with depression of the musical instrument keys by the musician.

Apparatus for playing arpeggio has also been well-known in the electronic musical keyboard arts. Arpeggios have traditionally been played manually. However, apparatus has also been provided for the automatic playing of arpeggio. See, for example, the copending application of W. R. Hoskinson, Peter Solender, and W. V. Machanian entitled "Accompaniment System for Electronic Musical Instrument", filed Mar. 15, 1978 under Ser. No. 886,750 assigned to the same assignee as the present application, namely The Wurlitzer Company.

OBJECTS AND SUMMARY OF THE PRESENT INVENTION

In accordance with conventional practice in the prior art for low cost electronic musical instruments, an arpeggio of a chord has been limited to the bass root plus three additional partials, generally the third, fourth and fifth. This has hitherto been necessary in order to keep the electronics of prior art low cost instruments simple enough to be priced competitively. In accordance with the present invention, it is desired also to add the fifth, sixth and seventh partials, and also to provide for including no bass at all. It further is desired to produce the partials of the arpeggio in either of two octaves. In accordance with known practices, the bass root and five additional partials for two octaves could be stored in twelve tracks or columns of a ROM. However, this is wasteful of the capacity of a ROM, and requires too large a ROM to be practical in a low-cost system.

Accordingly, it is an object of the invention to provide a system of producing rhythm patterns in an electronic musical instrument which will provide increased flexibility in the patterns that can be generated without increasing the complexity of electronics required.

It is another object of the invention to provide a system for generating rhythm patterns in a low cost electronic musical instrument which provides a musically acceptable degree of flexibility in the patterns that can be produced by increasing the efficiency of utilization of electronic circuits included in the system.

It is a special object of the present invention to provide storage of an arpeggio or bass rhythm pattern for twelve different partials of a bass rhythm pattern in only four columns of a ROM.

These and related objects are attained by storing six partials plus a "no bass" in digital form in three columns of a ROM, with the fourth column used to determine which of two octaves is to play. This approach requires less than one third of the ROM capacity required to store the same information in accordance with prior art techniques. Thus, the ROM capacity may either be reduced in size, or the extra capacity available may be used to provide additional functions in the electronic musical instrument.

The increased number of partials that may be stored in a given ROM capacity in accordance with this invention gives more flexibility in the provision of bass rhythm patterns. The bass rhythm patterns may be provided in straight arpeggio fashion or they may be provided in different formats as desired.

THE DRAWINGS

Additional objects and advantages and those heretofore set forth will be understood with reference to the following specification when taken in connection with the accompanying drawings wherein:

FIG. 1 comprises a diagrammatic representation of a known technique for storing the bass rhythm patterns;

FIG. 2 comprises a diagrammatic representation of storage of the bass pattern in accordance with the present invention;

FIG. 3 comprises a schematic wiring diagram of the apparatus in accordance with the present invention; and FIG. 4 represents a part of FIG. 3 with added ROM columns.

DETAILED DESCRIPTION OF THE INVENTION

Figure 1:
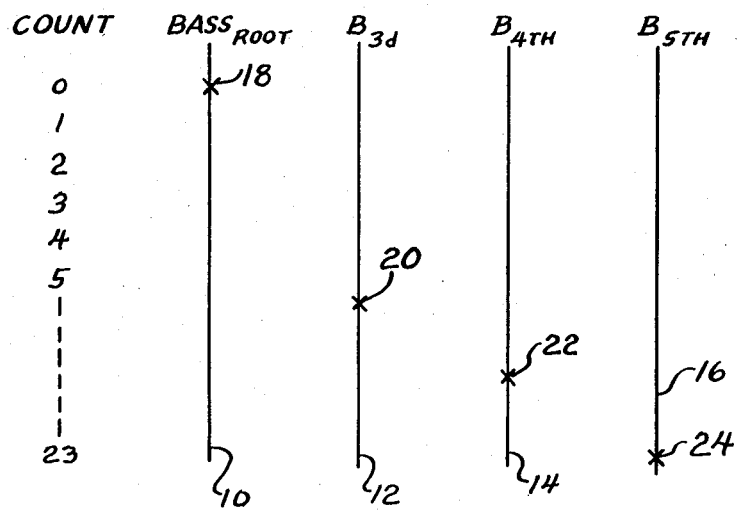

As is known, it is common practice to repeat a rhythm pattern: i.e., a basic cycle of one pattern, 24 or sometimes 48 counts. Twenty-four is used herein as exemplary, and with reference to FIG. 1, the counts of 0 through 23 are shown in the left column. The four vertical lines, respectively labeled as 10, 12, 14 and 16, somewhat diagrammatically, represent the columns of a ROM. It should be understood that there is a memory storage circuit or device in each column at each position of the count shown. Each such memory circuit or device is capable of assuming one of two states to indicate a binary "0" or "1". The bass root for a chord is indicated in the left column 10, and specifically an x appears on the column at 18 opposite count 0. The third partial of the bass root appears on column 12, and by way of example, this may occur somewhere between counts 5 and 23 as indicated by the ×20 on column 12. The fourth partial of the bass root is stored in the column identified as 14, specifically at the ×22 somewhere between counts 5 and 23. Finally, the ×24 in column 16 indicates the fifth partial as being stored at count 23. It will be understood that the counts herein are arbitrary, and that any particular count could be used in accordance with the desires of the designer. Since only a bass root and three of its partials can be stored in a four column ROM in accordance with this prior art technique, only a limited amount of flexibility may be obtained with this amount of ROM capacity.

Figure 2:
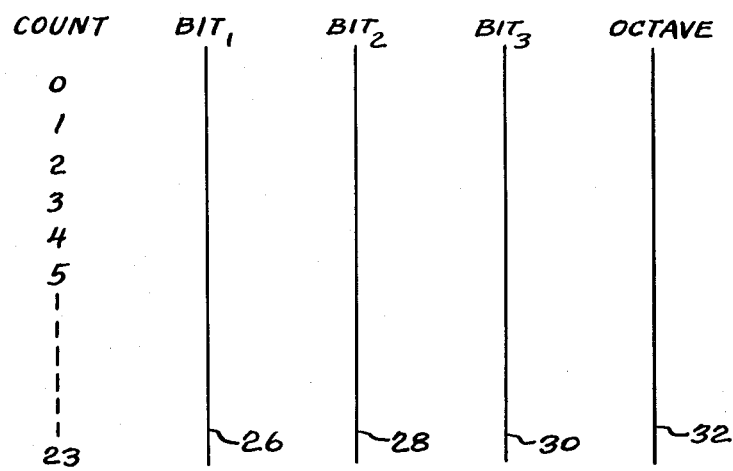

FIG. 2 is representative of the present invention and the counts 0 through 23 again are shown in the left column. Four columns of bits in a ROM are identified as 26, 28, 30 and 32, respectively. The first three columns comprise bits 1, 2 and 3 of a binary number. The fourth column, 32, comprises the octave storage column. Storage of the bass root, third, fourth, fifth, sixth and seventh, and also "no bass" is in straight binary form in the following table, the left three bits corresponding to the bits or columns of FIG. 2, and the octave column 32 being represented as 0 throughout:

$B_{root} = 0000$
$B3rd = 0010$
$B4th = 0100$
$B5th = 0110$
$B6th = 1000$
$B7th = 1010$
No Bass = 1110

Any of the root or partials just noted can be shifted up one octave in accordance with the present storage scheme by replacing the 0 digit in the fourth column with a 1. Thus, the bass root shifted up one octave would be represented as 0001.

As will be apparent, the bass root and five additional partials as well as no bass can be stored in accordance with the above table. The bass root may be on the first count, or any other count as desired by the designer. Once a bass root has been played, the system will play the rhythm pattern as stored in the ROM by generating, the additional frequencies required for the partials as specified in the ROM patterns. The third, fourth, fifth, sixth and seventh partials can thus be on any desired subsequent counts. Of the counts 0 through 23 on which neither the bass root nor one of the listed partials is to be reproduced, the "no bass" will be stored, namely the three ones. Storing this information in the format shown in FIG. 2 requires only 28 percent of the ROM capacity that would be required using the prior art format of FIG. 1.

Figure 3:
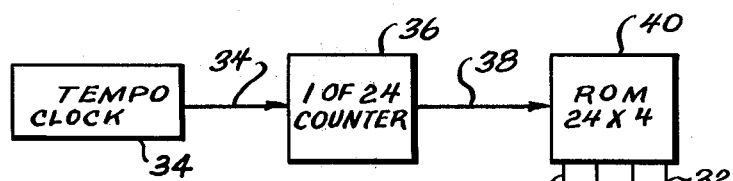
Figure 4:
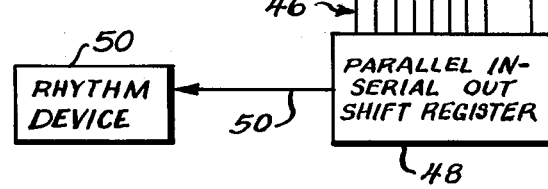

A circuit for exemplifying FIG. 2 is shown in FIG. 3, wherein a source of timing signals comprising tempo clock is indicated at 34 and leads to a one of twenty-four counter 36. For each pulse of the tempo clock, the counter produces an output of 0 through 23, as discussed heretofore, and then the counter recycles. The counter 36 is connected at 38 to the first four columns of a 24×4 ROM 40. Actually, the ROM may have many additional columns therein for other purposes, and this is indicated by the added portion 42 in FIG. 4.

The first three columns 26, 28 and 30 of the ROM 40 are connected to the input of a 1 of 8 decoder 44. The 8 parallel outputs thereof indicated generally at 46 are connected to a parallel in-serial out shift register 48.

In addition, the fourth column 32 of the ROM 40 is connected directly to the shift register 48. The 1 of 8 decoder insures only one possible bass trigger on each word shifted out of the shift register. The output pulses from the shift register are an output means for utilizing the pulses to generate musical sounds, i.e., a rhythm device 50 or the like to provide the desired rhythm voices. The tempo clock input at 34 is from the rhythm device tempo clock to insure synchronism. Since the use of these output pulses to generate rhythm patterns is carried out in a manner known in the art, it does not constitute part of the present invention and will not be disclosed in detail.

It is preferred to implement the circuitry shown in FIG. 3 with transistor-transistor logic (TTL) and TTL compatible circuits. Thus, the ROM 40 can be a commercially available DM 8577. The decoder 44 can be a commercially available DM 8223, and the parallel in-serial out shift register can be a series of commercially available DM 7495's. All of these integrated circuits may be obtained from National Semiconductor Corporation; Santa Clara, Calif. Rather than implement the system with these separate integrated circuit chips, the circuitry shown in FIG. 3 can be provided in an especially preferred embodiment as a single, custom designed integrated circuit chip specifically intended for this system and including equivalent circuitry to that provided by the above-identified standard integrated circuit parts. Such a custom chip can be laid out and fabricated by techniques known to those skilled in the integrated circuit art and not forming a part of this invention.

As is common in computer technology the rows of the ROM may be referred to as words and the columns may be referred to as bits. In the present invention the ROM may be spoken of alternatively as having M rows and N columns, or as having M words of N bits. The disclosed system employing N columns or bits provides $2^N$ possible combinations. Since the last or Nth bit or column is reserved for octave storage, the rhythm pattern information is stored in the first N minus one (N−1) bits or columns.

Various changes from the foregoing examples will no doubt occur to those skilled in the art and will be understood as forming a part of the present invention insofar as they fall within the spirit and scope of the appended claims.

The invention is claimed as follows:

1. In an electronic musical instrument, apparatus for storing rhythm patterns comprising memory storage means arranged as M words by N bits wherein M defines the basic cycle of one pattern and the N bits define one combination of output states out of $2^N$ possible combinations, and means for transferring information from said memory storage means to a means for utilizing the rhythm patterns, wherein the memory storage means comprises a read only memory, and further wherein the read only memory comprises four columns, three of said columns storing digital information as to desired rhythm notes and the fourth column stores information as to which octave the rhythm notes should play in.

2. In an electronic musical instrument, apparatus for storing rhythm patterns comprising memory storage means arranged as M words by N bits wherein M defines the basic cycle of one pattern and the N bits define one combination of output states out of $2^N$ possible combinations, and means for transferring information from said memory storage means to a means for utilizing the rhythm patterns, the transferring means comprising a 1 to 8 decoder connected to receive the first N−1 bits but not the Nth bit, means for converting parallel information from said memory storage to serial information, and additional means connecting the parallel-to-serial converting means to receive the Nth bit.

3. An electronic musical instrument, which comprises: (A) a source of timing signals, (B) a counter responsive to said source of timing signals for incrementing to a predetermined count, (C) a memory organized in rows and columns and responsive to signals from said counter for supplying rhythm information during each increment of said counter, information in each row uniquely identifying a particular bass root, a partial of that bass root, or no root to be played during the increment corresponding to that row of the columns containing the information, (D) means for transferring the information contained in a row to an output during each increment, and (E) means for utilizing the information connected to the output, each row corresponding to an increment in said memory which identifies a bass root or a partial of a bass root includes a first portion consisting of a plurality of bits, one for each column of the first portion, identifying the particular root or its partial root, and a second portion identifying an octave in which the bass root or its partial is to be played.

4. An electronic musical instrument, which comprises: (A) a source of timing signals, (B) a counter responsive to said source of timing signals for incrementing to a predetermined count, (C) a memory organized in rows and columns and responsive to signals from said counter for supplying rhythm information during each increment of said counter, information in each row uniquely identifying a particular bass root, a partial of that bass root or no root to be played during the increment corresponding to that row of the columns containing the information; (D) decoding means connected to an output of said memory, (E) a shift register connected to a plurality of outputs from said decoding means for receiving signals in parallel fashion corresponding to the information supplied to said decoding means from said memory, and (F) means connected to an output of said shift register for receiving information from said shift register in serial fashion and for generating musical sounds corresponding to a bass root or a partial of a bass root identified by signals from said memory during a particular increment.

5. The electronic musical instrument of claim 4 in which each row corresponding to an increment in said memory which identifies a bass root or a partial of a bass root includes a first portion consisting of a plurality of bits, one in each column of the first portion, identifying the particular bass root or its partial root, and a second portion identifying an octave in which the bass root or its partial is to be played.

6. The electronic musical instrument of claim 5 in which an output of said memory which receives information from the second portion of each row is connected directly to said shift register, an output receiving the information from the first portion of each row being connected to said shift register through said decoder.

7. The electronic musical instrument of claim 5 in which said memory is a read only memory.

* * * * *

UNITED STATES PATENT AND TRADEMARK OFFICE
CERTIFICATE OF CORRECTION

PATENT NO. : 4,216,693
DATED : August 12, 1980
INVENTOR(S) : WILLIAM V. MACHANIAN, ANTHONY C. IPPOLITO & WILLIAM R. HOSKINSON It is certified that error appears in the above-identified patent and that said Letters Patent are hereby corrected as shown below:

Column 4, line 39, change the first occurrence of "to" to --of--.

Signed and Sealed this

Twenty-fifth Day of November 1980

[SEAL]

Attest:

SIDNEY A. DIAMOND

Attesting Officer

Commissioner of Patents and Trademarks